United States Patent
Lasch et al.

(10) Patent No.: US 12,482,739 B2
(45) Date of Patent: Nov. 25, 2025

(54) ARRANGEMENT FOR A SEMICONDUCTOR ARRANGEMENT COMPRISING AT LEAST ONE PASSIVE COMPONENT AND A SUBSTRATE

(71) Applicant: Siemens Aktiengesellschaft, Munich (DE)

(72) Inventors: Markus Lasch, Munich (DE); Roland Lorz, Röttenbach (DE); Markus Pfeifer, Nuremberg (DE); Stefan Stegmeier, Munich (DE); Erik Weisbrod, Munich (DE); Ronny Werner, Nuremberg (DE); Felix Zeyss, Erlangen (DE)

(73) Assignee: Siemens Aktiengesellschaft, Munich (DE)

( * ) Notice: Subject to any disclaimer, the term of this patent is extended or adjusted under 35 U.S.C. 154(b) by 0 days.

(21) Appl. No.: 18/834,521

(22) PCT Filed: Nov. 28, 2022

(86) PCT No.: PCT/EP2022/083400
§ 371 (c)(1),
(2) Date: Jul. 30, 2024

(87) PCT Pub. No.: WO2023/147910
PCT Pub. Date: Aug. 10, 2023

(65) Prior Publication Data
US 2025/0112142 A1   Apr. 3, 2025

(30) Foreign Application Priority Data
Feb. 1, 2022 (EP) .................................. 22154511

(51) Int. Cl.
*H01L 23/498* (2006.01)
*H05K 1/05* (2006.01)

(52) U.S. Cl.
CPC ....... *H01L 23/49844* (2013.01); *H05K 1/053* (2013.01); *H05K 2201/098* (2013.01); *H05K 2201/10022* (2013.01)

(58) Field of Classification Search
CPC ............. H05K 1/053; H05K 2201/098; H05K 2201/10022; H05K 1/0306; H05K 3/3478;
(Continued)

(56) References Cited

U.S. PATENT DOCUMENTS

2015/0163916 A1   6/2015  Obara et al.
2016/0007486 A1*  1/2016  Kim ..................... H01L 21/52
                                          361/752
(Continued)

FOREIGN PATENT DOCUMENTS

EP   2 578 068 B1   11/2016
EP   3 825 823 A1    3/2020
(Continued)

OTHER PUBLICATIONS

PCT International Search Report and Written Opinion of International Searching Authority mailed Apr. 17, 2023 corresponding to PCT International Application No. PCT/EP2022/083400 filed Nov. 28, 2022.

*Primary Examiner* — Suberr L Chi
(74) *Attorney, Agent, or Firm* — Henry M. Feiereisen LLC

(57) ABSTRACT

An arrangement for a semiconductor arrangement includes a substrate including a dielectric material layer and a first metallization arranged on the dielectric material layer. A passive component is arranged completely in a cutout of the first metallization and bears directly on the dielectric material layer. The passive component is designed to include a first profile. The the first metallization includes a second
(Continued)

profile in a region of contacting with the passive component, with the first and second profiles engaging with one another.

15 Claims, 7 Drawing Sheets

(58) Field of Classification Search
CPC .... H05K 2201/10166; H01L 23/49844; H01L 23/49811; H01L 23/49833; H01L 23/34; H01L 23/3735
See application file for complete search history.

(56) References Cited

U.S. PATENT DOCUMENTS

| | | |
|---|---|---|
| 2018/0301398 A1* | 10/2018 | Otremba ........... H01L 23/49524 |
| 2020/0381370 A1 | 12/2020 | Pfefferlein |
| 2022/0208643 A1 | 6/2022 | Bigl et al. |
| 2023/0154882 A1* | 5/2023 | Tsuruoka ............ H01L 23/3735 257/690 |

FOREIGN PATENT DOCUMENTS

| | | |
|---|---|---|
| JP | 2009246063 A | 10/2009 |
| WO | WO 2020/249478 A1 | 12/2020 |

* cited by examiner

FIG 10
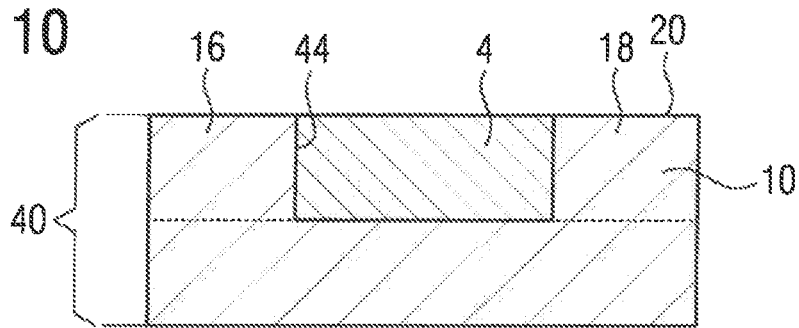
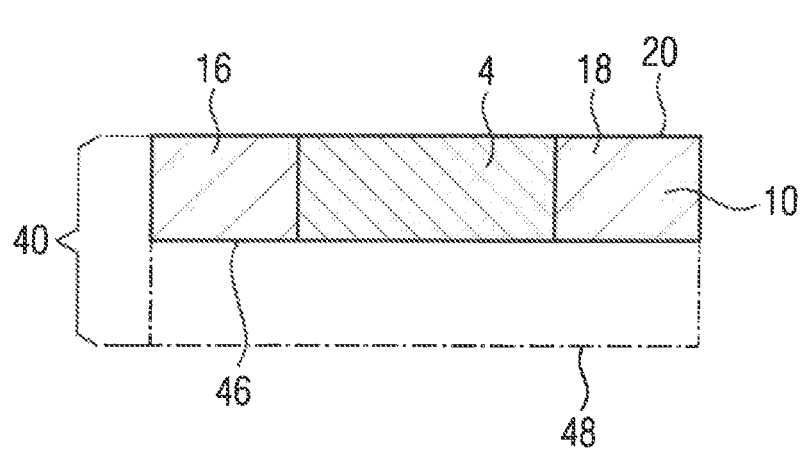
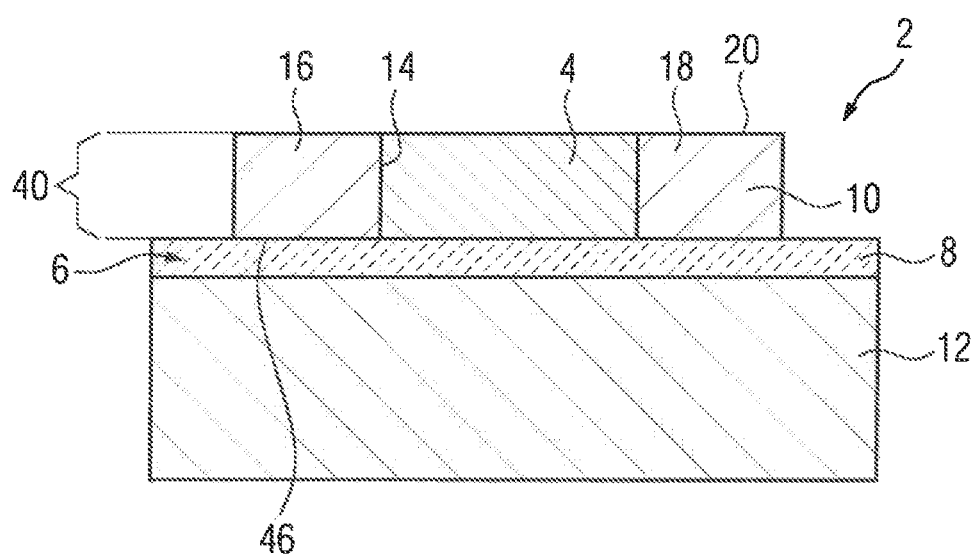

ARRANGEMENT FOR A SEMICONDUCTOR ARRANGEMENT COMPRISING AT LEAST ONE PASSIVE COMPONENT AND A SUBSTRATE

CROSS-REFERENCES TO RELATED APPLICATIONS

This application is the U.S. National Stage of International Application No. PCT/EP2022/083400, filed Nov. 28, 2022, which designated the United States and has been published as International Publication No. WO 2023/147910 A1 and which claims the priority of European Patent Application, Serial No. 22154511.4, filed Feb. 1, 2022, pursuant to 35 U.S.C. 119(a)-(d).

BACKGROUND OF THE INVENTION

The invention relates to an arrangement for a semiconductor arrangement comprising at least one passive component and a substrate, the substrate comprising a dielectric material layer and a first metallization arranged on the dielectric material layer.

The invention further relates to a semiconductor arrangement, in particular a planar semiconductor arrangement, comprising at least one such arrangement.

The invention furthermore relates to a power converter comprising at least one semiconductor arrangement.

The invention additionally relates to a method for producing an arrangement for a semiconductor arrangement comprising at least one passive component and a substrate, the substrate comprising a dielectric material layer and a first metallization arranged on the dielectric material layer.

Such arrangements are used for example in a power converter. A power converter should be understood for example as a rectifier, an inverter, a converter or a d.c-d.c. converter. Components such as capacitors, snubbers and also sensors can be used in a power converter, among other things to detect currents, voltages or temperatures, and are normally soldered onto a substrate. Such sensors can for example comprise a shunt resistor or a negative temperature coefficient thermistor (NTC for short). The components can be arranged partially in a current-carrying path or in the region of a heat source, for example in order to achieve accurate measurement results, wherein sufficient cooling must be ensured. Furthermore, with increasing miniaturization the installation space and the service life present a great challenge.

The unexamined patent application EP 3 625 823 A1 describes a power module having at least one power semiconductor, in particular a power transistor, which has a first contact area and a second contact area opposite the first contact area, and a substrate, which comprises at least two layers connected to one another and arranged above one another. In order to achieve a higher resistance to moisture compared to the prior art and to make possible a low-inductance planar connection of the at least one power semiconductor it is proposed that the first layer comprises a first dielectric material having at least one first metallization, wherein the first metallization is arranged on a side facing toward the second layer, wherein the second layer comprises a second dielectric material having at least one second metallization, wherein the second metallization is arranged on a side facing away from the first metallization, wherein the power semiconductor is connected to the first metallization via the first contact area, wherein the power semiconductor is arranged in a first cutout of the second layer, wherein a metallic first encapsulation is arranged such that the power semiconductor is encapsulated in a fluid-tight manner and the second contact area of the power semiconductor is electrically conductively connected to the second metallization via the first encapsulation.

The unexamined patent application WO 2020/249479 A1 describes an electronic circuit having a first and a second circuit carrier and a first and a second semiconductor component. The first semiconductor component lies with its upper side on an underside of the first circuit carrier and with its underside on an upper side of the second circuit carrier. The first circuit carrier has a first via which connects the first semiconductor component to a first conducting path. The first circuit carrier has a second via which electrically connects a connection element arranged between the circuit carriers to a further conducting path.

Against this backdrop, it is an object of the present invention to reduce the installation space of such an arrangement and to enable improved cooling.

SUMMARY OF THE INVENTION

In the case of an arrangement of the type mentioned in the introduction, this object is achieved in that the passive component is arranged completely in a cutout of the first metallization and bears directly on the dielectric material layer.

The object is further inventively achieved by a semiconductor arrangement, in particular a planar semiconductor arrangement, comprising at least one such arrangement.

Furthermore, the object is inventively achieved by a power converter comprising at least one semiconductor arrangement.

In the case of a method of the type mentioned in the introduction, the object is additionally achieved in that the passive component is arranged completely in a cutout of the first metallization, such that the passive component bears directly on the dielectric material layer.

The advantages and preferred embodiments set out below in respect of the arrangement can be transferred analogously to the semiconductor arrangement, the power converter and the method.

The invention is based on the consideration of reducing the installation space of at least one passive component in an arrangement for a semiconductor arrangement, in that this is arranged completely in a cutout of a first metallization of a substrate. In this connection a cutout is a continuous recess in the first metallization. This continuous recess can have, among other things, a rectangular outer contour. A semiconductor arrangement can be, among other things, a power semiconductor module. Such a passive component, in particular an at least partially metallic passive component, can be embodied as, among other things, a resistance sensor, in particular as a shunt resistor or as an NTC. For example, such a resistance sensor is made at least partially of an alloy which can contain, among other things, Zeranin, Manganin, constantan, Isaohm or a cold conductor such as platinum. The first metallization of the substrate can for example contain copper, silver or gold. By integrating the passive component into the first metallization in this way, installation space is saved, in particular in the vertical direction.

In order to enable a sufficient thermal connection and thus efficient cooling of the at least one passive component, this bears directly, i.e. without any further connection means, on the dielectric material layer of the substrate. The dielectric material layer can contain, among other things, a ceramic material, for example aluminum nitride or aluminum oxide, or an organic material, for example a polyamide or epoxy resin. In particular, the, for example substantially cuboid, passive component is connected to the dielectric material layer over the entire surface. Such a connection not only provides improved cooling but also saves installation space, since, among other things, other components can be positioned closer to the passive component. Further, thanks to the integration of the at least one passive component, the production process is simplified, as there is no placement process and no soldering.

A further form of embodiment provides that the passive component is flush with a first surface of the first metallization. Such a flush fitting makes it easier to press the first metallization onto the passive component, so that the passive component can be reliably contacted with the dielectric material layer over the entire surface.

A further form of embodiment provides that the first metallization is embodied as a thick copper substrate, wherein the passive component is pressed together with the dielectric material layer over the entire surface between two sides of the thick copper substrate. Such a thick copper substrate has a copper thickness of at least 1 mm. Such a connection is robust and easy to produce.

A further form of embodiment provides that the passive component is connected directly or via connection means in the cutout of the first metallization. A direct connection can for example be produced by direct pressing together or by a shrink connection. By means of the connection means, a press-fit connection is for example produced, via which the passive component is connected to the first metallization. Such force-fit connections are robust and easy to produce.

A further form of embodiment provides that the passive component is made of a first material, wherein the connection means contain a second material which differs from the first material at least as regards its mechanical and/or thermal properties. Connection means can for example be small tin plates or a coating of the passive component, which for example contains copper-tin (Cu—Sn), copper-nickel-silicon (Cu—Ni—Si) or copper-chromium-silver (Cu—Cr—Ag). Thanks to different mechanical and/or thermal properties, such as expansion coefficient and/or elasticity module, thermal stresses occurring during operation are for example reduced. Alternatively, the connection means can be used to produce a material-bonded connection between the passive component and the first metallization. For example, a small tin plate is melted to produce a material-bonded connection. By reducing stresses, in particular thermal stresses, such connections help to extend a service life of the arrangement.

A further form of embodiment provides that the passive component has a first profile and the first metallization in the region of contacting with the passive component has a second profile, the profiles being engaged with one another. For example, the first metallization has a recess, in particular a flange and/or a chamfer, and engages with an at least partially corresponding protrusion of the passive component, as a result of which a form-fit connection is formed. Thanks to such a form-fit connection the reliability of the connection is increased.

A further form of embodiment provides that the passive component is connected to the dielectric material layer via a force acting through the form-fit connection perpendicular to the first surface. Thanks to such a connection, stresses acting on the passive component are reduced.

A further form of embodiment provides that the substrate has a second metallization, which is embodied as a thick copper substrate, wherein the dielectric material layer is laminated onto the second metallization or is pressed together with the second metallization, wherein the second metallization is connected to the first metallization via the dielectric material layer. Such a production process enables the production of a very thin substrate layer, thereby improving heat dissipation via the second metallization.

A further form of embodiment provides that the passive component is embodied as' a sensor and the arrangement comprises at least one terminal for contacting the sensor. For example, the sensor is embodied as a shunt resistor which contains Zeranin, Manganin, constantan, Isaohm. Integrating such a shunt resistor improves the thermal connection, so that high measurement accuracy and a long service life can be achieved. Alternatively, the sensor can be embodied as a temperature sensor, for example as an NTC, which contains a cold conductor, in particular platinum. By improving the thermal connection to the environment via the substrate, accurate temperature detection is enabled.

BRIEF DESCRIPTION OF THE DRAWING

The invention is described and explained in greater detail below on the basis of the exemplary embodiments represented in the figures, in which:

FIG. 10 shows a schematic representation of a third method for producing an arrangement comprising a passive component and a substrate.

DETAILED DESCRIPTION OF PREFERRED EMBODIMENTS

Figure 1:
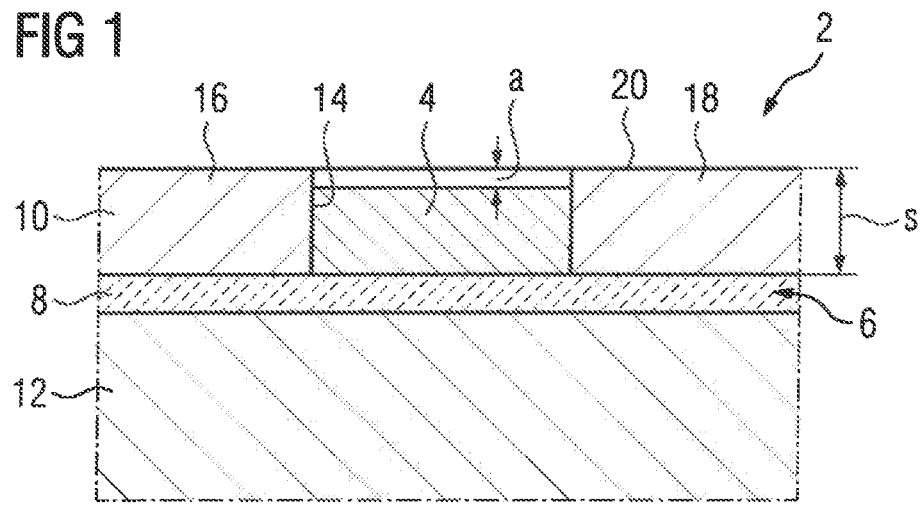
FIG. 1 shows a schematic cross-sectional representation of a first form of embodiment of an arrangement comprising a passive component and a substrate.

The exemplary embodiments explained below are preferred forms of embodiment of the invention. In the exemplary embodiments, the described components of the forms of embodiment each represent individual features of the invention that are to be considered independently of one another and that in each case also develop the invention independently of one another and are thus also to be regarded as a constituent part of the invention individually or in a combination other than the one shown. Furthermore, the described forms of embodiment can also be supplemented by other features of the invention already described.

The same reference characters have the same meaning in the various figures.

FIG. 1 shows a schematic cross-sectional representation of a first form of embodiment of an arrangement 2 comprising a passive component 4 and a substrate 6. The substrate 6 comprises a dielectric material layer 8 which is arranged between a first metallization 10 and a second metallization 12, wherein the first metallization 10 is connected to the second metallization 12 in an electrically insulating and thermally conductive manner via the dielectric material layer 8. The dielectric material layer 8 can contain, among other things, a ceramic material, for example aluminum nitride or aluminum oxide, an organic material, for example a polyamide, or an organic material filled with a ceramic material. The first metallization 10 and the second metallization 12 are by way of example embodied as a thick copper substrate with a thickness s of at least 1 mm. The first metallization 10 has a cutout 14, in which the passive component 4 is arranged. The passive component 4 is arranged completely in the cutout 14, i.e. it does not protrude out over the cutout 14. The, in particular metallic, passive component 4 can be embodied as, among other things, a resistance sensor, in particular as a shunt resistor or as an NTC. For example, such a resistance sensor is made of an alloy which can contain, among other things, Zeranin, Manganin, constantan, Isaohm or a cold conductor such as platinum.

The cutout 14 of the first metallization 10 is embodied as a continuous recess up to the dielectric material layer 8. The passive component 4, which in FIG. 1 is embodied as substantially cuboid, is connected directly, i.e. without any further connection means, between a first side 16 and a second side 18 of the thick copper substrate. For example, the passive component 4 is connected in a force-fit manner to the thick copper substrate, in particular by direct pressing together or by a shrink connection. Furthermore, the passive component 4 connected to the thick copper substrate is pressed together with the dielectric material layer 8 over the entire surface, wherein the passive component 4 bears directly on the dielectric material layer 8 over the entire surface and is thus connected to the second metallization 12 in an electrically insulating and thermally conductive manner. Therefore heat arising in the passive component 4 can be dissipated via the dielectric material layer 8. In addition, a good thermal connection can be produced to adjacent components, such as for example a power semiconductor component. Furthermore, the passive component 4 terminates at a distance a, which for example lies in the μm range, below a first surface 20 of the first metallization 10, wherein the first surface 20 of the first metallization 10 defines a horizontal plane. The passive component 4 is therefore integrally arranged in the substrate 6, so that installation space is saved in the vertical direction.

Figure 2:
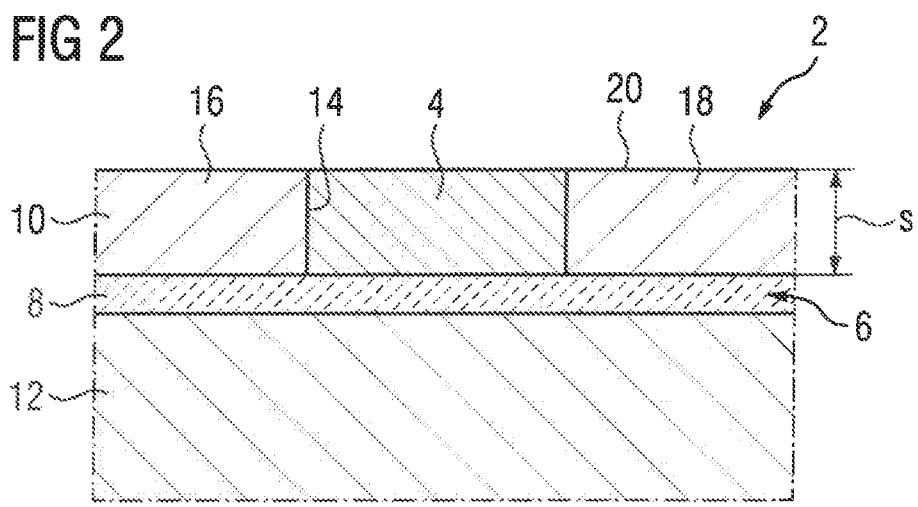
FIG. 2 shows a schematic cross-sectional representation of a second form of embodiment of an arrangement comprising a passive component and a substrate.
Figure 3:
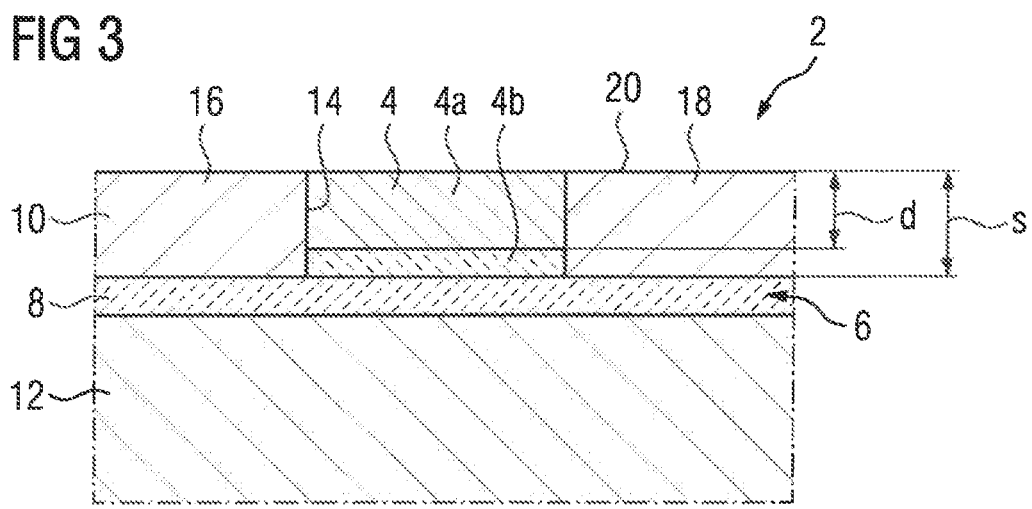
FIG. 3 shows a schematic cross-sectional representation of a third form of embodiment of an arrangement comprising a passive component and a substrate.

FIG. 2 shows a schematic cross-sectional representation of a second form of embodiment of an arrangement 2 comprising a passive component 4 and a substrate 6, wherein the passive component 4 arranged, in particular connected in a force-fit manner, in the cutout 14 of the first metallization 10, is flush with the first surface 20 of the first metallization 10. The passive component 4 is arranged integrated in the substrate 6, wherein installation space is saved in the vertical direction. Furthermore, the flush fitting makes it easier to press the first metallization 10 onto the passive component 4, so that the passive component 4 can be reliably contacted with the dielectric material layer 8 over the entire surface. The further embodiment of the arrangement 2 in FIG. 2 corresponds to that in FIG. 1, FIG. 3 shows a schematic cross-sectional representation of a third form of embodiment of an arrangement comprising a passive component 4 and a substrate 6. The passive component 4 comprises a metallic layer 4a and a dielectric layer 4b arranged on a side of the metallic layer 4a facing toward the dielectric material layer 8. The dielectric layer 4b is embodied as electrically insulating and can contain, among other things, an organic material, in particular a plastic, or a ceramic material. The dielectric layer 4b enables a thermally conductive connection of the metallic layer 4a of the passive component 4 to the dielectric material layer 8. Among other things, by varying a thickness d of the metallic layer 4a a resistance value of the passive component 4 that is flush with the first surface 20 of the first metallization 10 can be flexibly adjusted. The further embodiment of the arrangement 2 in FIG. 3 corresponds to that in FIG. 2.

Figure 4:
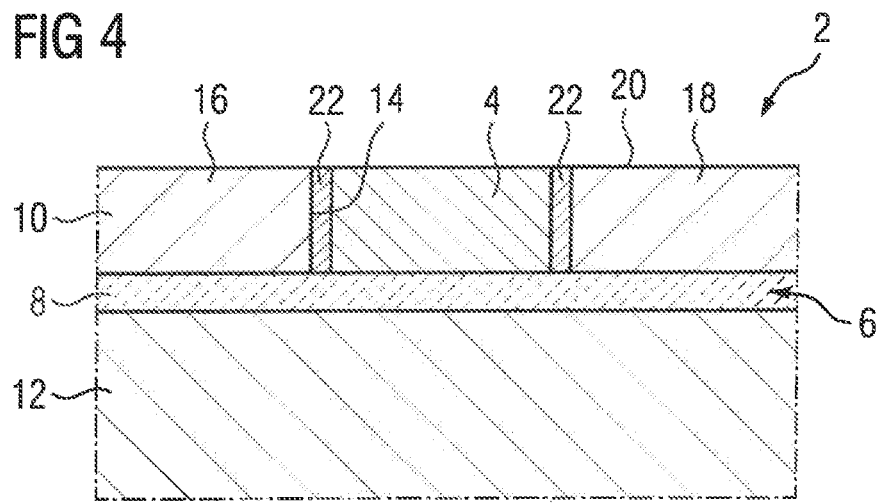
FIG. 4 shows a schematic cross-sectional representation of a fourth form of embodiment of an arrangement comprising a passive component and a substrate.

FIG. 4 shows a schematic cross-sectional representation of a fourth form of embodiment of an arrangement 2 comprising a passive component 4 and a substrate 6, wherein the passive component 4 is connected on both sides via connection means 22 in the cutout 14 of the first metallization 10. The connection means 22 are for example small tin plates. Alternatively, the connection means 22 can be a coating, in particular of the passive component 4, which for example contains copper-tin (Cu—Sn), copper-nickel-silicon (Cu—Ni—Si) or copper-chromium-silver (Cu—Cr—Ag). By means of the connection means 22 a press-fit connection is produced, via which the passive component 4 is connected to the first metallization 10. Thanks to different mechanical and/or thermal properties, such as expansion coefficient and/or elasticity module, thermal stresses occurring for example during operation are reduced. Alternatively, a material-bonded connection is produced between the passive component 4 and the first metallization 10 via the connection means 22. The further embodiment of the arrangement 2 in FIG. 4 corresponds to that in FIG. 3.

Figure 5:
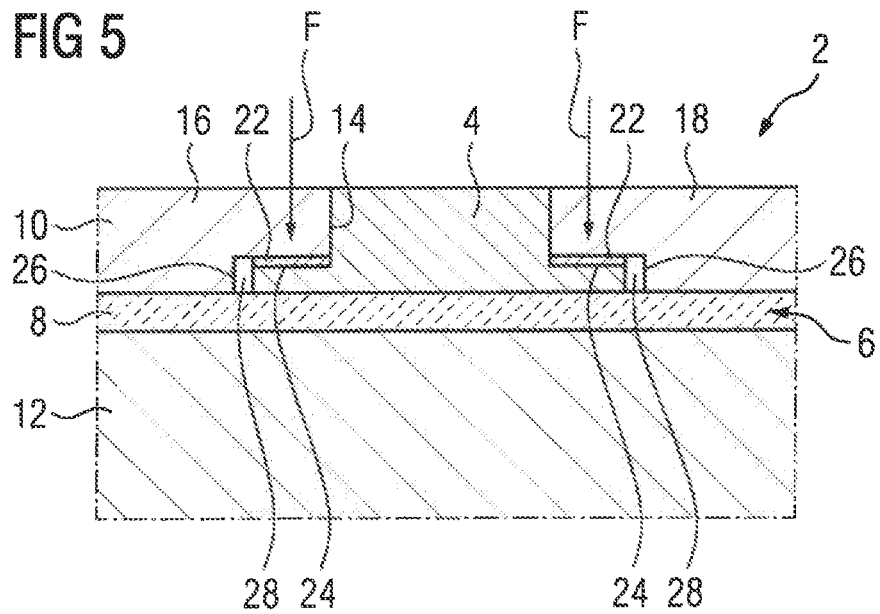
FIG. 5 shows a schematic cross-sectional representation of a fifth form of embodiment of an arrangement comprising a passive component and a substrate.

FIG. 5 shows a schematic cross-sectional representation of a fifth form of embodiment of an arrangement 2 comprising a passive component 4 and a substrate 6, wherein the passive component 4 has a first profile 24 on both sides in each case and the first metallization 10 in the region of contacting with the passive component 4 in each case has a second profile 26. By way of example, the first metallization 10 has a recess in the form of a flange, wherein the passive component 4 has a protrusion which engages with the recess of the first metallization 10. Thanks to the profiles 24 and 26 which are engaged with one another a form-fit connection is formed. Additionally or alternatively, the profiles 24 and 26 each have a chamfer. Arranged on a side of the protrusion facing away from the dielectric material layer 8 are connection means 22 in each case, in particular small tin plates, which connect the passive component 4 to the first metallization 10. The arrangement 2 has balancing structures 28 to compensate for expansions, in particular thermally conditioned expansions. Thus, the passive component 4 is connected to the dielectric material layer 8 via a force F acting through the form-fit connection perpendicular to the first surface 20. The further embodiment of the arrangement 2 in FIG. 5 corresponds to that in FIG. 4.

Figure 6:
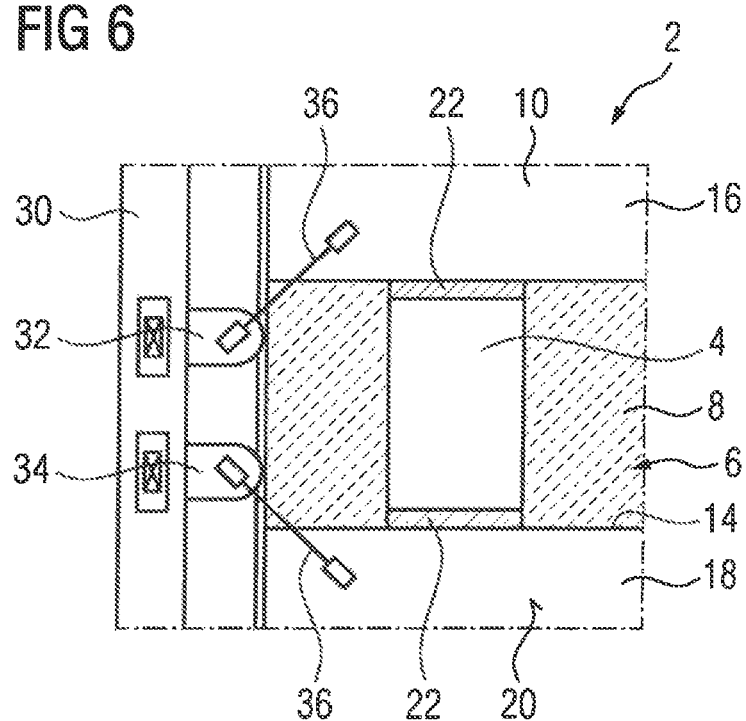
FIG. 6 shows a schematic representation of a segment of a sixth form of embodiment of an arrangement comprising a passive component and a substrate in a top view.

FIG. 6 shows a schematic representation of a segment of a sixth form of embodiment of an arrangement 2 comprising a passive component 4 and a substrate 6 in a top view. The arrangement 2 is arranged in a housing 30 and comprises terminals 32, 34 for contacting the passive component 4. The terminals 32, 34 are by way of example embodied as housing pins which are connected via bond connection means 36, in particular bond wires, to one side 16, 18 in each case of the first metallization 10. Thus the passive component 4 is contacted by the terminals 32, 34 such that for example it is possible to determine a voltage dropping across the passive component 4 or a current flowing through the passive component 4. In particular, the passive component 4 is embodied as an NTC resistor for use as a temperature sensor, wherein the NTC resistor contains platinum. The further embodiment of the arrangement 2 in FIG. 6 corresponds to that in FIG. 4.

Figure 7:
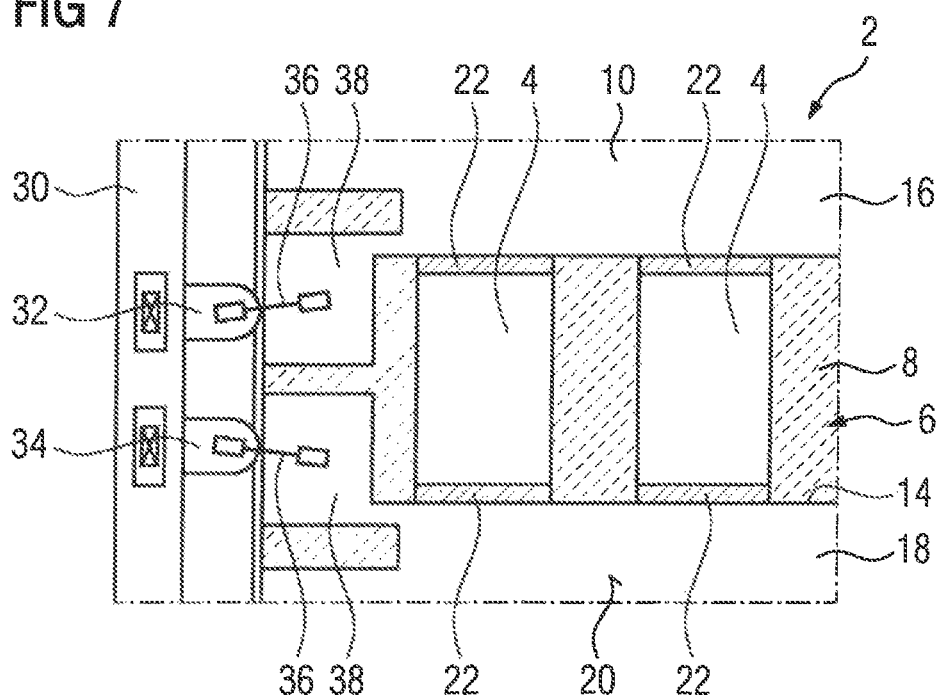
FIG. 7 shows a schematic representation of a segment of a seventh form of embodiment of an arrangement comprising a passive component and a substrate in a top view.

FIG. 7 shows a schematic representation of a segment of a seventh form of embodiment of an arrangement comprising a passive component and a substrate in a top view, wherein by way of example two passive components 4 are connected in parallel. The passive components 4 are by way of example embodied as shunt resistors for measurement of a load current in a power semiconductor module and are made of an alloy which contains Zeranin, Manganin, constantan or Isaohm. The first metallization 10 has a contact pad 38 on both sides 16, 18 for contacting the terminals 32, 34. The terminals 32, 34 are connected to the contact pads 38 via bond connection means 36, in particular bond wires. Via the terminals 32, 34 it is possible to detect a voltage drop across the passive components 4, in particular to detect a current. The further embodiment of the arrangement 2 in FIG. 7 corresponds to that in FIG. 6.

Figure 8:
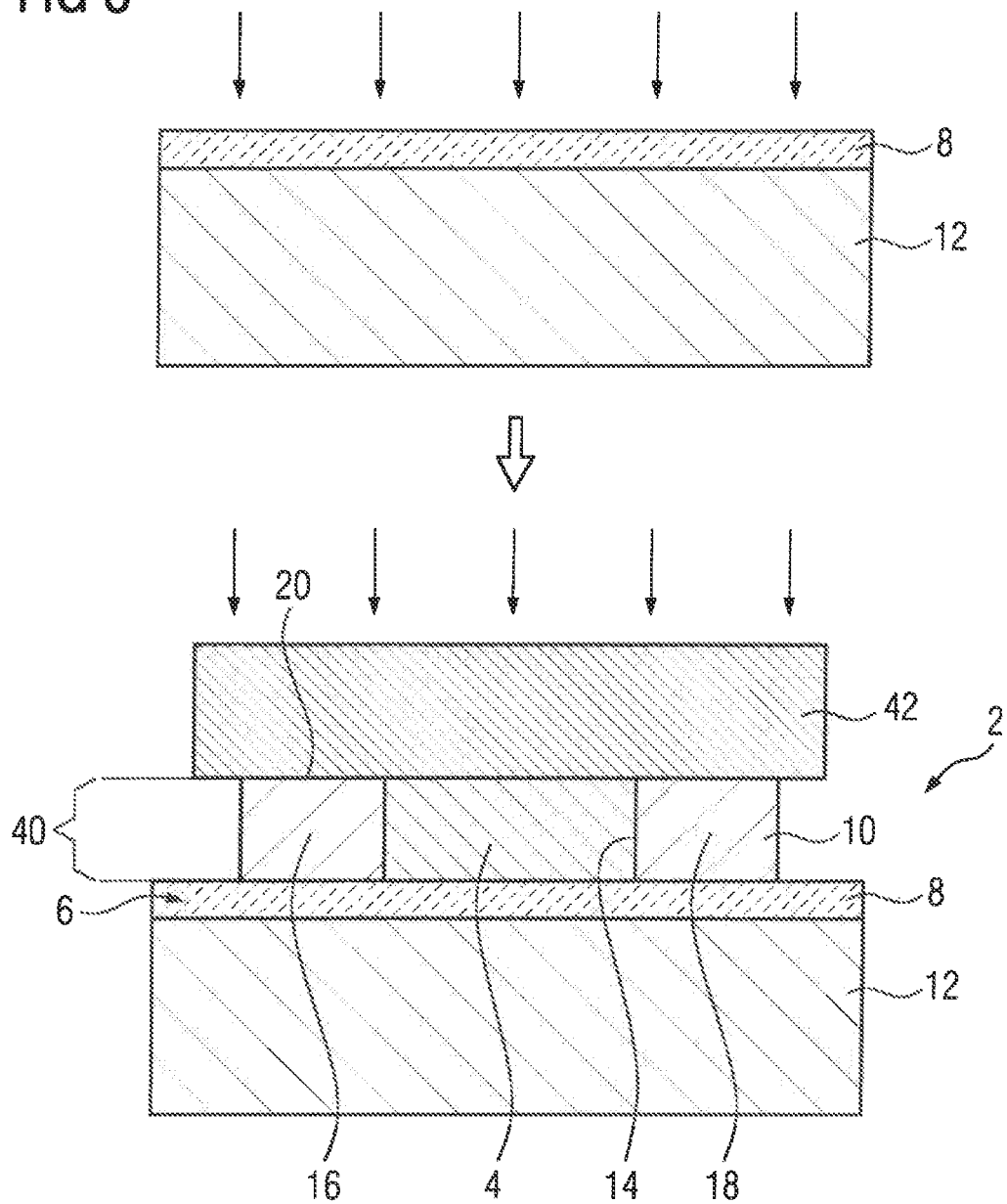
FIG. 8 shows a schematic representation of a first method for producing an arrangement comprising a passive component and a substrate.

FIG. 8 shows a schematic representation of a first method for producing an arrangement 2 comprising a passive component 4 and a substrate 6. A dielectric material layer 8 is laminated onto a second metallization 12, which is embodied as a thick copper substrate. Alternatively, the dielectric material layer 8 is connected by pressing together with the second metallization 12.

In a further step a passive component 4 is introduced into a cavity 44 of a first metallization 10 embodied as a thick copper substrate and is connected between two sides 16, 18 of the first metallization 10 to form a top layer 40. Using a pressing device 42, for example a press die, in particular a flat press die, the top layer 40 is pressed together with the dielectric material layer 8 such that the passive component 4 bears on the dielectric material layer 8 over the entire surface and directly, and is flush with a first surface 20 of the first metallization 10. Connecting the passive component 4 to the first metallization 10 and pressing it together with the dielectric material layer 8 using the pressing device 42 can take place simultaneously. The steps shown in FIG. 8 can be performed in one pressing process, in particular if the dielectric can only be cured once. The further embodiment of the arrangement 2 in FIG. 8 corresponds to that in FIG. 2.

Figure 9:
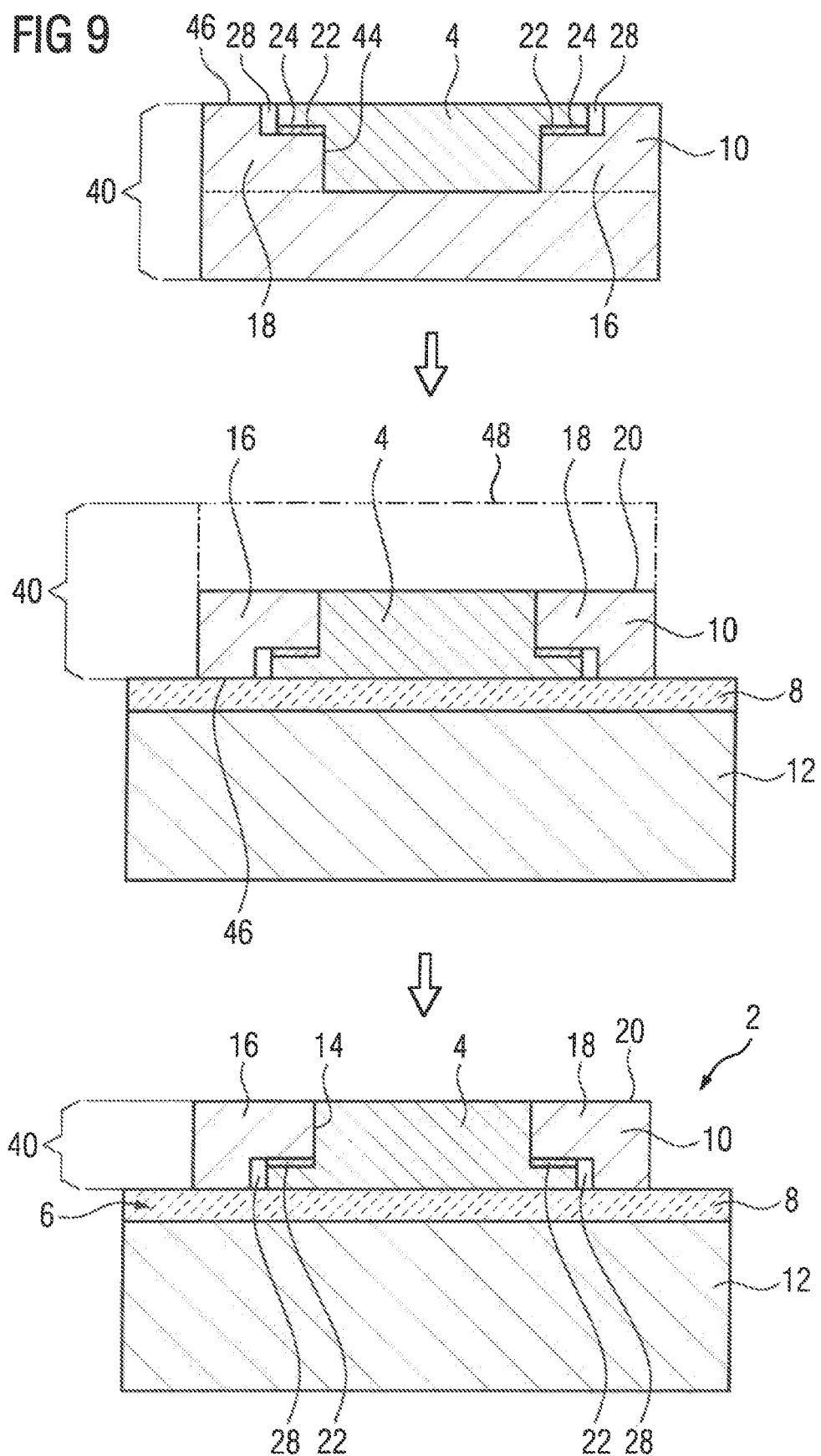
FIG. 9 shows a schematic representation of a second method for producing an arrangement comprising a passive component and a substrate.

FIG. 9 shows a schematic representation of a second method for producing an arrangement 2 comprising a passive component 4 and a substrate 6, wherein the passive component 4 is introduced into a cavity 44 of the first metallization 10 embodied as a thick copper substrate and is connected to the first metallization 10 to form a top layer 40. The cavity 44 of the first metallization 10 has on both sides 16, 18 a recess in the form of a flange, wherein the passive component 4 has a protrusion which engages with the recess of the first metallization 10. As shown in FIG. 5, the passive component 4 is connected to the first metallization 10 via connection means 22, in particular small tin plates, in the region of its protrusions arranged on both sides, and the arrangement 2 has balancing structures 28 to compensate for, in particular thermally conditioned, expansions. The balancing structures 28 are filled with a filler material, for example with silicone, in order to prevent partial discharges. The passive component 4 is flush with a second surface 46 of the first metallization 10.

In a further step the top layer 40 is pressed together with the dielectric material layer 8 via the second surface 46, such that the passive component 4 bears directly on the dielectric material layer 8.

In a subsequent step a layer 48 of the first metallization 10 arranged on a side facing away from the passive component 4 is removed by machining, for example by milling, such that the cavity 44 becomes a cutout 14 in the first metallization 10. Furthermore, due to the removal of the layer 48 the passive component 4 is exposed, wherein the passive component 4 is flush with the first surface 20 of the first metallization 10. The further embodiment of the arrangement 2 in FIG. 9 corresponds to that in FIG. 5.

FIG. 10 shows a schematic representation of a third method for producing an arrangement 2 comprising a passive component 4 and a substrate 6, wherein the passive component 4 is introduced into a cavity 44 of the first metallization 10 embodied as a thick copper substrate and is connected to the first metallization 10 to form a top layer 40. For example, the passive component 4 is connected in a force-fit manner to the thick copper substrate, in particular by direct pressing together or by a shrink connection. The passive component 4 is flush with the first surface 20 of the first metallization 10.

In a further step a layer 48 of the first metallization 10 arranged on a side facing away from the passive component 4 is removed, in particular by machining, such that the passive component 4 is exposed and the passive component 4 is flush with a second surface 46 of the first metallization 10.

In a subsequent step the remaining part of the top layer 40 is pressed together with the dielectric material layer 8 via the second surface 46, such that the passive component 4 bears directly on the dielectric material layer 8. The further embodiment of the arrangement 2 in FIG. 9 corresponds to that in FIG. 5.

Figure 11:
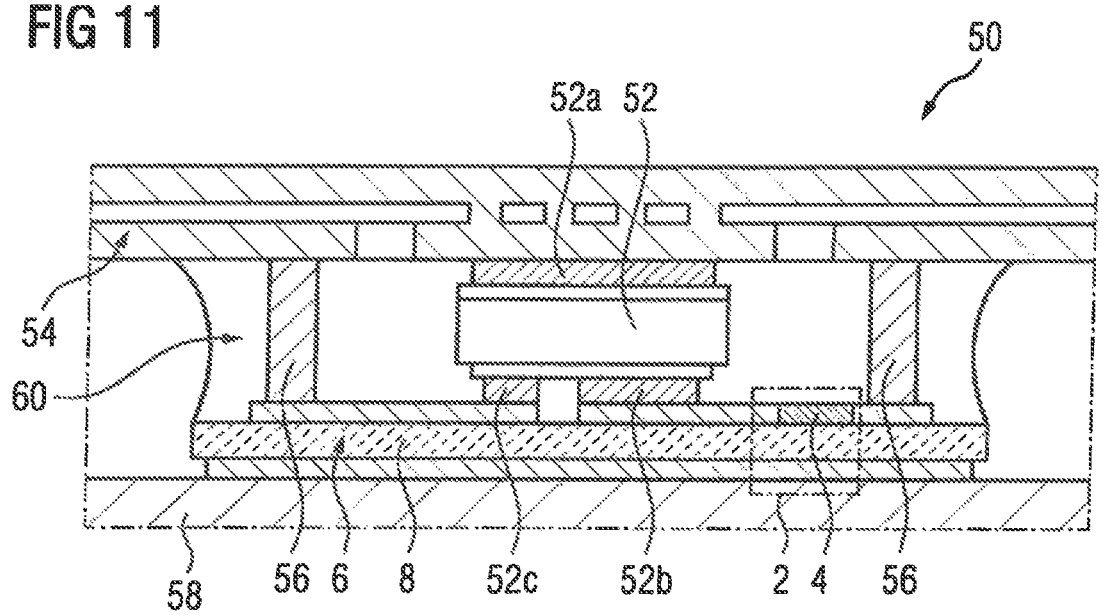
FIG. 11 shows a schematic cross-sectional representation of a semiconductor arrangement and FIG. 12 shows a schematic representation of a power converter.

FIG. 11 shows a schematic cross-sectional representation of a semiconductor arrangement 50, which comprises a semiconductor component 52 that is realized by means of planar mounting and connection technology. The semiconductor component 52 is embodied by way of example as a vertical power transistor, in particular as an insulated gate bipolar transistor (IGBT). The power transistor is connected to a circuit board 54, in particular a printed circuit board (PCB), via a first power terminal 52a. On a side opposite the first power terminal 52a the power transistor is connected via a second power terminal 52b and a control terminal 52c to a substrate 6 which is embodied as a DCB substrate. The second power terminal 52b and the control terminal 52c are electrically conductively connected to the circuit board 54 via spacer elements 56, also called switches. Furthermore, the semiconductor arrangement 50 has an arrangement 2 comprising a passive component 4 which can be embodied in accordance with one of the preceding figures. The passive component 4 is for example configured to detect a current of the second power terminal 52b. The substrate 6 is further connected to a heat sink 58, for example a cooling element, so that the semiconductor component 52 and the passive component 4 are connected to the heat sink 58 in an electrically insulating and thermally conductive manner.

Arranged between the circuit board 54 and the substrate 6 is a potting material 60, in which the semiconductor component 52, the spacer elements 56 and the passive component 4 are embedded. The potting material 60 is manufactured for example with the aid of an underfiller.

Figure 12:
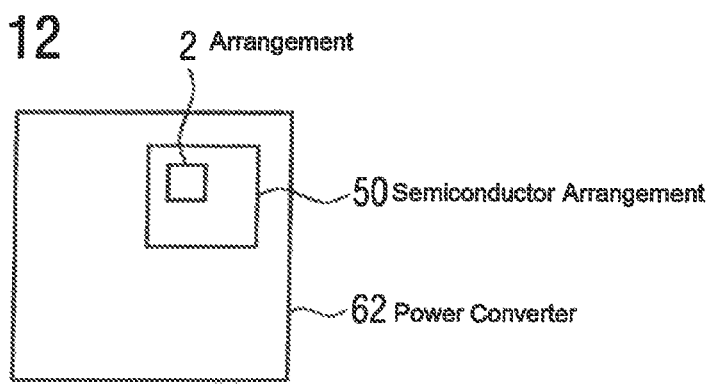

FIG. 12 shows a schematic representation of a power converter, which by way of example has a semiconductor arrangement 50 comprising an arrangement 2.

In summary, the invention relates to an arrangement 2 for a semiconductor arrangement 50 comprising at least one passive component 4 and a substrate 6, wherein the substrate 6 has a dielectric material layer 8 and a first metallization 10 arranged on the dielectric material layer 8. In order to reduce the installation space of the arrangement 2 and to enable improved cooling, it is proposed that the passive component 4 is arranged completely in a cutout 14 of the first metallization 10 and bears directly on the dielectric material layer 8.

The invention claimed is:

1. A semiconductor arrangement comprising:
a substrate including a dielectric material layer and a first metallization arranged on the dielectric material layer; and
a passive component arranged completely in a cutout of the first metallization and bearing directly on the dielectric material layer, said passive component including a first profile having a protrusion and a connection arranged on a side of the protrusion facing away from the dielectric material layer, wherein the first metallization includes a second profile having a recess, with the first profile protrusion and the second profile recess engaging with one another and the connection connecting the passive component to the first metallization.

2. The arrangement of claim 1, wherein the passive component is flush with a first surface of the first metallization.

3. The arrangement of claim 2, wherein the passive component is connected to the dielectric material layer via a force acting through a form-fit connection perpendicular to the first surface of the first metallization.

4. The arrangement of claim 1, wherein the first metallization is embodied as a thick copper substrate, with the passive component being pressed together with the dielectric material layer over an entire surface between two sides of the thick copper substrate.

5. The arrangement of claim 1, wherein the passive component is connected directly or via the connection in the cutout of the first metallization.

6. The arrangement of claim 5, wherein the passive component is made of a first material, and wherein the connection contains a second material which differs from the first material at least as regards its mechanical and/or thermal properties.

7. The arrangement of claim 1, wherein the substrate includes a second metallization which is embodied as a thick copper substrate, with the dielectric material layer being laminated onto the second metallization or pressed together with the second metallization, said second metallization being connected to the first metallization via the dielectric material layer.

8. The arrangement of claim 1, wherein the passive component is embodied as a sensor, the arrangement further comprising a terminal for contacting the sensor.

9. A method for producing an arrangement for a semiconductor arrangement, the method comprising:
providing a passive component with a first profile having a protrusion and a connection arranged on a side of the protrusion facing away from the dielectric material layer;
forming a substrate with a dielectric material layer and a first metallization which is arranged on the dielectric material layer and includes a second profile having a recess;
arranging the passive component completely in a cutout of the first metallization, such that the passive component bears directly on the dielectric material layer; and
engaging the first profile protrusion and the second profile recess with one another and the connection connecting the passive component to the first metallization.

10. The method of claim 9, further comprising arranging the passive component in the cutout such as to be flush with a first surface of the first metallization.

11. The method of claim 9, wherein the first metallization is embodied as a thick copper substrate, the method further comprising pressing the passive component together with the dielectric material layer over an entire surface between two sides of the thick copper substrate.

12. The method of claim 9, further comprising connecting the passive component directly or via connectors in the cutout of the first metallization.

13. The method of claim 9, wherein the first metallization is embodied as a thick copper substrate, the method further comprising:
Introducing the passive component into a cavity of the first metallization;
connecting the passive component to the first metallization to form a top layer;
pressing together the top layer with the dielectric material layer such that the passive component bears directly on the dielectric material layer;
arranging a layer of the first metallization on a side facing away from the passive component; and
removing the layer, in particular by machining, such that the passive component is exposed and is flush with a first surface of the first metallization.

14. The method of claim 9, wherein the first metallization is embodied as a thick copper substrate, the method further comprising:
introducing the passive component into a cavity of the first metallization;
connecting the passive component to the first metallization to form a top layer, such that the passive component is flush with a first surface of the first metallization;
arranging a layer of the first metallization on a side facing away from the passive component;
removing the layer, in particular by machining, such that the passive component is exposed and is flush with a second surface of the first metallization; and
pressing together the top layer with the dielectric material layer such that the passive component bears directly on the dielectric material layer.

15. The method of claim 9, further comprising:
providing the substrate with a second metallization which is embodied as a thick copper substrate; and
laminating the dielectric material layer onto the second metallization or pressing together the dielectric material layer with the second metallization.

* * * * *